(12) United States Patent
Poppe et al.

(10) Patent No.: US 8,610,243 B2
(45) Date of Patent: Dec. 17, 2013

(54) METAL E-FUSE WITH INTERMETALLIC COMPOUND PROGRAMMING MECHANISM AND METHODS OF MAKING SAME

(75) Inventors: Jens Poppe, Radebeul (DE); Andreas Kurz, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/315,647

(22) Filed: Dec. 9, 2011

(65) Prior Publication Data

US 2013/0147008 A1  Jun. 13, 2013

(51) Int. Cl.
*H01L 23/52* (2006.01)

(52) U.S. Cl.
USPC .............. 257/529; 257/50; 257/106; 257/530; 257/598; 438/131; 438/257; 438/600

(58) Field of Classification Search
USPC ........................................................ 257/529
See application file for complete search history.

(56) References Cited

U.S. PATENT DOCUMENTS

| | | | |
|---|---|---|---|
| 5,172,237 A | 12/1992 | Blonstein et al. | |
| 5,257,230 A | 10/1993 | Nobori et al. | |
| 5,469,981 A * | 11/1995 | Srikrishnan et al. | 216/13 |
| 5,587,598 A | 12/1996 | Hatanaka | |
| 6,372,556 B1 | 4/2002 | Ko | |
| 6,541,792 B1 * | 4/2003 | Tran et al. | 257/50 |
| 6,580,144 B2 * | 6/2003 | Anthony | 257/529 |
| 7,087,975 B2 * | 8/2006 | Lehmann et al. | 257/530 |
| 7,098,721 B2 | 8/2006 | Ouellette et al. | |
| 7,679,484 B2 | 3/2010 | Onoda et al. | |
| 7,737,528 B2 | 6/2010 | Bonilla et al. | |
| 8,101,505 B2 * | 1/2012 | Abou-Khalil et al. | 438/467 |
| 2002/0036926 A1 * | 3/2002 | Imamiya et al. | 365/185.29 |
| 2003/0031047 A1 * | 2/2003 | Anthony et al. | 365/175 |
| 2005/0110113 A1 * | 5/2005 | Lin et al. | 257/530 |
| 2006/0157819 A1 | 7/2006 | Wu | |
| 2006/0258121 A1 * | 11/2006 | Wu | 438/467 |
| 2007/0114635 A1 * | 5/2007 | Cho et al. | 257/529 |
| 2007/0222028 A1 | 9/2007 | Matsuoka et al. | |
| 2008/0157269 A1 * | 7/2008 | Wong et al. | 257/529 |
| 2008/0206978 A1 * | 8/2008 | Hsu et al. | 438/601 |
| 2008/0217735 A1 * | 9/2008 | Chen et al. | 257/529 |
| 2008/0224118 A1 * | 9/2008 | Doyle et al. | 257/4 |
| 2009/0085152 A1 * | 4/2009 | Bernstein et al. | 257/529 |
| 2009/0146250 A1 * | 6/2009 | Ono | 257/529 |
| 2009/0239377 A1 * | 9/2009 | Motoyama | 438/643 |
| 2010/0013045 A1 * | 1/2010 | Weeks | 257/529 |
| 2010/0072571 A1 | 3/2010 | Min | |
| 2010/0090751 A1 * | 4/2010 | Cheng et al. | 327/525 |

(Continued)

FOREIGN PATENT DOCUMENTS

JP  11086587 A  *  3/1999

*Primary Examiner* — N Drew Richards
*Assistant Examiner* — Ankush Singal
(74) *Attorney, Agent, or Firm* — Williams, Morgan & Amerson, P.C.

(57) ABSTRACT

Disclosed herein is a metal e-fuse device that employs an intermetallic compound programming mechanism and various methods of making such an e-fuse device. In one example, a device disclosed herein includes a first metal line, a second metal line and a fuse element that is positioned between and conductively coupled to each of the first and second metal lines, wherein the fuse element is adapted to be blown by passing a programming current therethrough, and wherein the fuse element is comprised of a material that is different from a material of construction of at least one of the first and second metal lines.

24 Claims, 4 Drawing Sheets

(56) References Cited

U.S. PATENT DOCUMENTS

| | | | |
|---|---|---|---|
| 2010/0117190 A1* | 5/2010 | Chuang et al. | 257/529 |
| 2010/0230780 A1* | 9/2010 | Obayashi | 257/529 |
| 2011/0045644 A1* | 2/2011 | Barth et al. | 438/132 |
| 2011/0074538 A1* | 3/2011 | Wu et al. | 337/187 |
| 2011/0092031 A1* | 4/2011 | Yang et al. | 438/132 |
| 2011/0156858 A1 | 6/2011 | Poppe et al. | |
| 2011/0169127 A1* | 7/2011 | Hsu et al. | 257/529 |
| 2011/0241817 A1* | 10/2011 | Doi | 337/290 |
| 2012/0187529 A1* | 7/2012 | Maciejewski et al. | 257/529 |
| 2012/0196434 A1* | 8/2012 | Thei et al. | 438/601 |
| 2012/0249159 A1* | 10/2012 | Filippi et al. | 324/538 |

* cited by examiner

METAL E-FUSE WITH INTERMETALLIC COMPOUND PROGRAMMING MECHANISM AND METHODS OF MAKING SAME

BACKGROUND OF THE INVENTION

1. Field of the Invention

Generally, the present disclosure generally relates to the manufacturing of sophisticated semiconductor devices, and, more specifically, to a metal e-fuse device that employs an intermetallic compound programming mechanism and various methods of making such an e-fuse device.

2. Description of the Related Art

With continued scaling in semiconductor technologies to increasingly smaller geometries, on-chip e-fuse implementations provide an attractive alternative to conventional fusing schemes for integrated circuits. In terms of area efficiency and performance impact, e-fuse technology presents a significant improvement over fuse technologies with optical based programming. Programmable devices for integrated circuits require a dependable methodology for customizing a device in a repeatable and reliable manner. Fusing of programmable connections in microprocessors, FPGAs and other VLSI designs is a common technique to achieve the flexibility of programmability. Common applications for e-fuse technology include memory array redundancy, package identification coding and post-manufacture programming of logical functions. Since each e-fuse is a single primitive device, additional logic and circuitry are necessary to facilitate programming and sensing.

A typical e-fuse device fabricated in silicon-based integrated circuits is typically programmed using a large voltage, relative to the operating voltage of the integrated circuit, to melt and separate the fuse body material. This process changes the fuse material from a low resistance to a high resistance, which may be measured by "sensing" circuitry to determine whether or not the e-fuse has been programmed. As process technology for integrated circuits has progressed, maximum operating voltages have scaled commensurately downward with physical geometry, making it difficult to provide sufficient voltage to program the e-fuse without damaging logic circuitry associated with the fuse bank. In addition, the current density requirements for metal interconnect layers used to supply e-fuse programming currents are typically much greater than for signal interconnect lines. As such, fuse programming buses must be implemented with wide metal wires that consume a disproportionate amount of interconnect resources.

Furthermore, some e-fuse devices may require multiple programming pulses to ensure adequate resistance levels for the e-fuse device, thereby increasing programming and test time cycles. However, repeated programming may also lead to an unfused condition in the programmed fuse if a sufficiently high voltage is applied. In that instance, the heating associated with re-programming may cause the fuse material to rejoin, thereby further degrading fuse-related yield.

The present disclosure is directed to a novel e-fuse device, and various methods of making such a device that may solve or at least reduce one or more of the problems set forth above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to an e-fuse device that employs an intermetallic compound programming mechanism and various methods of making such an e-fuse device. In one example, a device disclosed herein includes a first metal line, a second metal line and a fuse element that is positioned between and conductively coupled to each of the first and second metal lines, wherein the fuse element is adapted to be blown by passing a programming current therethrough, and wherein the fuse element is comprised of a material that is different from a material of construction of at least one of the first and second metal lines.

In another example, a device disclosed herein includes a first metal line comprised of a first material, a second metal line comprised of a second material that is different from the first material, and a fuse element that is positioned between and conductively coupled to each of the first and second metal lines, wherein the fuse element is adapted to be blown by passing a programming current therethrough.

In yet another illustrative example, a device disclosed herein includes a first metal line comprised of a first material, a second metal line comprised of the first material and a fuse element that is positioned between and conductively coupled to each of the first and second metal lines, wherein the fuse element is comprised of a second material that is different from the first material, and wherein the fuse element is adapted to be blown by passing a programming current therethrough.

BRIEF DESCRIPTION OF THE DRAWINGS

The disclosure may be understood by reference to the following description taken in conjunction with the accompanying drawings, in which like reference numerals identify like elements, and in which.

Figure 1A:
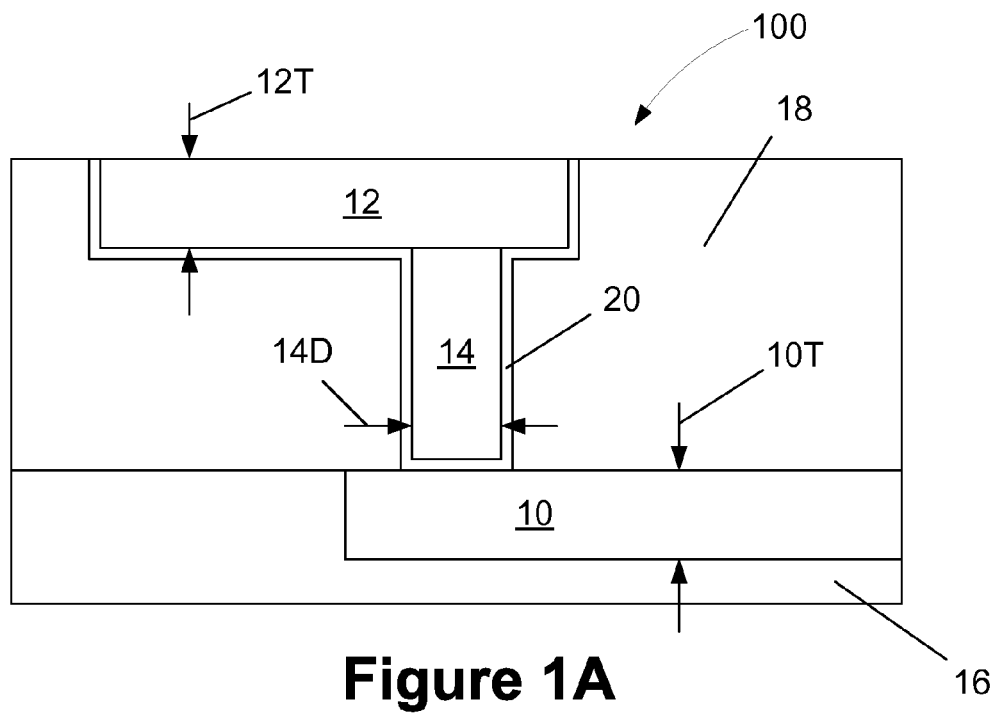
FIGS. 1A-1D depict one illustrative embodiment of the novel e-fuse structure disclosed herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to a metal e-fuse device that employs an intermetallic compound programming mechanism and various methods of making such an e-fuse device. As will be readily apparent to those skilled in the art upon a complete reading of the present application, the device disclosed herein may be employed with a variety of technologies, e.g., NMOS, PMOS, CMOS, etc., and it may be incorporated into a variety of devices, including, but not limited to, ASICs, logic devices, memory devices, etc. With reference to FIGS. 1A-1D, 2A-2C and 3, various illustrative embodiments of the methods and devices disclosed herein will now be described in more detail.

Figure 1B:
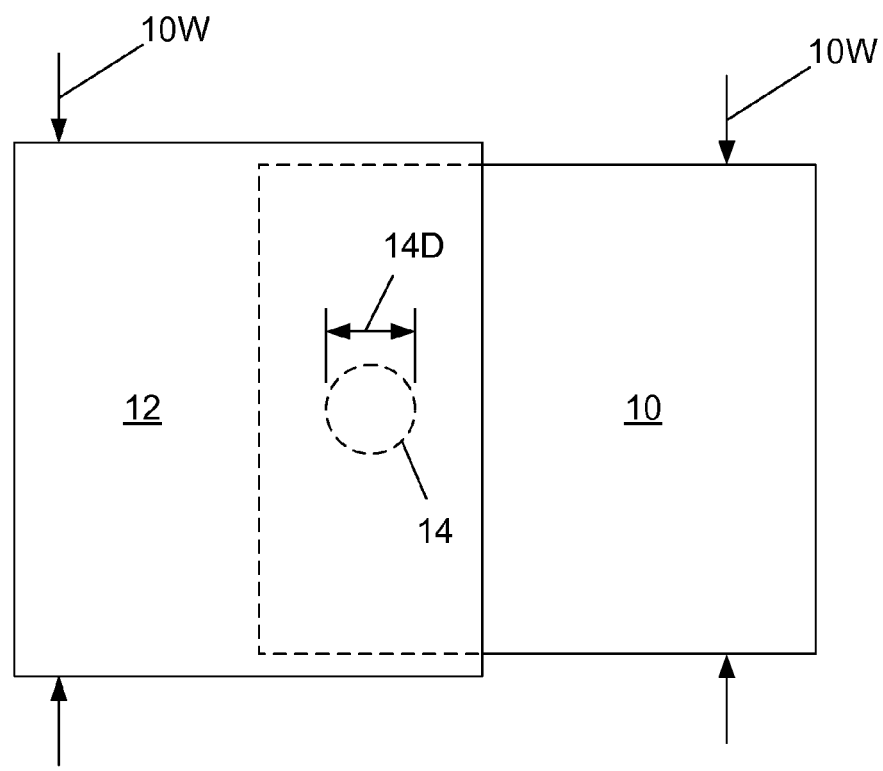

FIGS. 1A and 1B are, respectively, a cross-sectional view and a plan view of one illustrative embodiment of an e-fuse structure 100 disclosed herein. The e-fuse 100 may be formed in any type of integrated circuit product, it may be formed at any level within such an integrated circuit product and it may be employed in any type of circuit. The e-fuse 100 is comprised of a first metal line 10, a second metal line 12 and a fuse element 14 that are formed in various layers of insulating material. For example, the first metal line 10 may be formed in a first layer of insulating material, while the second metal line 12 and the fuse element 14 are formed in a second layer of insulating material 18. One or both of the metal lines 10, 12 may have one or more barrier or liner layers positioned between the metal line and the insulating material. For example, an illustrative barrier metal 20 is depicted as having been formed in connection with the formation of the second metal line 12 and the fuse element 14. The metal line 10 is depicted as having been formed without such a barrier layer.

The various structures depicted for the e-fuse 100 may be formed using traditional manufacturing tools and techniques that are commonly employed in manufacturing integrated circuit devices. For example, the insulating layers 16, 18 may be formed by performing a chemical vapor deposition (CVD) process. Openings of the lines 10, 12 and the fuse element 14 may be formed by performing one or more etching processes through a patterned photoresist mask (not shown). The lines 10, 12 and/or the fuse element 14 may be formed by traditional deposition and etching processes or by using single or dual damascene techniques.

In one illustrative embodiment disclosed herein, the first and second metal lines 10, 12 are made of different metals such that, when a programming voltage is applied to the e-fuse 100, intermetallic compound regions (described more fully below) are formed in one or both of the lines 10, 12 and perhaps in portions of the fuse element 14. The formation of these intermetallic compound regions causes the fuse element 14 to rupture. The intermetallic compound regions are very stable and they do not have a tendency to reform the fuse if they are subjected to multiple cycles of programming. For example, in one illustrative embodiment, the first metal line 10 may be made of aluminum while the second metal line 12 and the fuse element 14 may be made of copper, or the materials of construction for these components could be reversed. In the illustrative example disclosed in FIG. 1A, the barrier layer 20 may be a layer of tantalum nitride. A variety of other possible material combinations may be employed as well such as, for example, Au—Al, Ni—Al, Ni—Cu, Ag—Cu, etc. Stated another way, in this embodiment of the e-fuse 100, the fuse element 14 is made of a material that is different from the material used in at least one of the first and second metal lines 10, 12. In the example disclosed above, the fuse element 14 is comprised of copper and the first metal line 10 is comprised of aluminum.

In yet another illustrative example, where the lines 10, 12 are made of different materials, the fuse element 14 may be made of a material that may be different from the material of construction for either of the lines 10, 12. For example, the line 10 may be made of aluminum, the line 12 may be made of copper and the fuse element 14 may be made of titanium.

In another illustrative embodiment of the e-fuse 100 disclosed herein, the first and second metal lines 10, 12 may be made of the same material, e.g., copper, while the fuse element 14 is made of a different material, e.g., aluminum, i.e., a material that is different from the material of construction for both of the lines 10, 12.

In general, when reference is made herein and in the claims to the material of construction for the lines 10, 12 and the fuse element 14, to the extent a barrier or liner layer is formed adjacent to the line 10, the line 12 and/or the fuse element 14, the material of construction for the barrier or liner layer may be ignored. That is, the "material" or "material of construction" of the lines 10, 12 and the fuse element 14 refers to the material of construction for the bulk portion of the lines 10, 12 and the fuse element 14. Thus, for example, where the second metal line 12 is made of copper and a barrier metal 20 is present that is made of tantalum, the "material" or "material of construction" for the second metal line is copper—the barrier layer material is ignored.

The fuse element 14 and the lines 10, 12 may have a variety of different configurations. In one illustrative example, the fuse element 14 may be a generally circular post having a nominal width dimension or diameter 14D of about 40-100 nm. Of course, as will be recognized by those skilled in the art after a complete reading of the present application, the size of the fuse element 14 may vary and it may have other configurations, such as a rectangular post, etc. The thickness 10T of the first metal line 10 and the thickness 12T of the second metal line 12 may vary depending on the particular application. In some cases, they may have the same thickness, although that is not required. In general, the thickness of the lines 10, 12 will correspond to the thickness of other metal lines that are being formed for the integrated circuit device.

In one illustrative embodiment, as shown in FIG. 1B, the metal lines 10, 12 are relatively wide. For example, the width 10W of the first metal line 10 and the width 12W of the second metal line 12 may be about 5-8 times as wide as the width dimension 14D of the fuse element 14. The lines 10, 12 need not have the same width (as depicted in FIG. 1B) although they may have the same width in some applications.

Figure 1C:
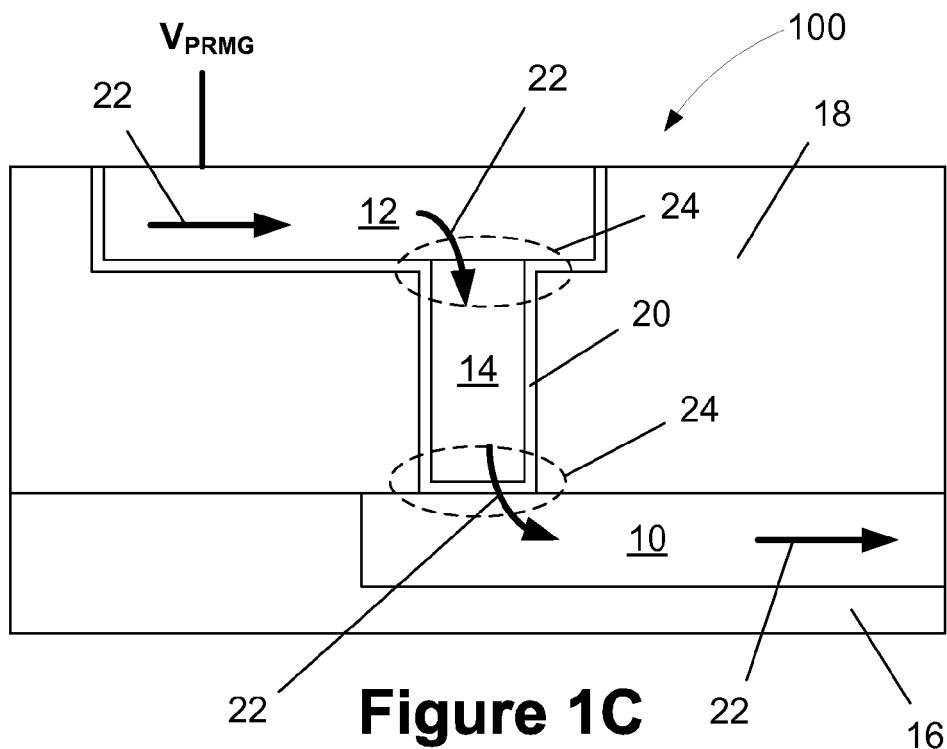

As shown in FIG. 1C, a programming voltage ($V_{PRMG}$) is applied to the second metal line 12 to cause a programming current 22 to flow through the fuse element 14 and then through the first metal line 10. Of course, the programming voltage ($V_{PRMG}$) could be applied to line 10 to cause the programming current 22 to flow in the opposite direction. The programming voltage ($V_{PRMG}$) is relatively large compared to the normal operating voltage that is used on the integrated circuit device so as to induce a relatively large programming current 22. In one illustrative embodiment, using current day technology, the programming voltage ($V_{PRMG}$) may be on the order of about 1-2 V, whereas a typical operating voltage may be on the order of about 1-1.5. Given the relatively small size of the fuse element 14, the programming current will cause localized heating (resistance heating or Joule heating) in the regions 24. This resistance heating does not occur in the main body of the lines 10, 12 due to the relatively large size of the lines 10, 12. Stated another way, the programming current density in the lines 10, 12 is relatively low, while the programming current density in the fuse element 14 is very high (e.g., 10-20 mA/cm$^2$). The programming voltage ($V_{PRMG}$) is applied for sufficient duration to insure that the fuse element 14 ruptures. The duration during which the programming voltage ($V_{PRMG}$) is applied to the e-fuse 100 will vary depending upon the particular application. In one embodiment, the programming voltage ($V_{PRMG}$) may be applied for a duration of about 10-50 milliseconds. In some applications, pulsed programming may also be employed (e.g., 50-150 ns ON; 150-200 ns OFF; 10-50 cycles) so that lower currents and lower voltages may be employed.

Figure 1D:
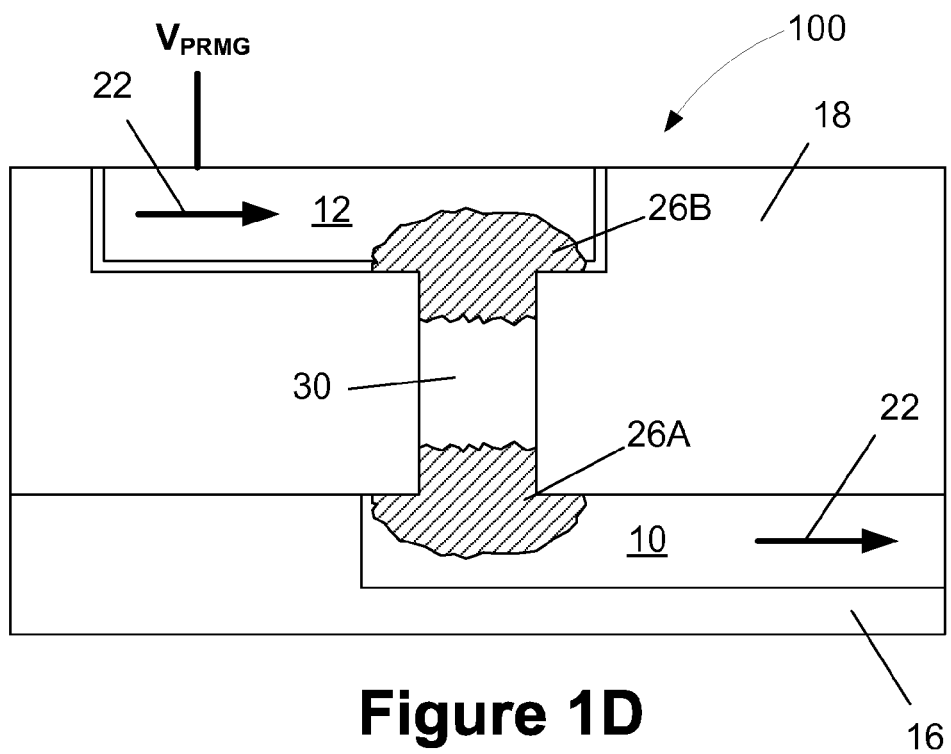

As shown in FIG. 1D, the relatively large programming current 22 causes the formation of one or more intermetallic compound regions, such as the illustrative intermetallic compound regions 26A, 26B. In one illustrative embodiment, the intermetallic region 26A will be "rich" with the material of the line 10, while the intermetallic region 26B will be "rich" with the material of the line 12. The intermetallic compound regions 26A, 26B have a more densely packed structure than does the metal used to make the fuse element 14. As the intermetallic compound regions 26A, 26B form, metal atoms from the fuse element 14 diffuse toward at least one of the metal lines 10, 12 (in the depicted embodiment the metal atoms from the fuse element 14 diffuse toward both of the lines 10, 12). In the illustrative example described above where the first metal line 10 is made of aluminum and the fuse element 14 is made of copper, the metal atoms diffuse so as to form copper/aluminum intermetallic compound regions 26A, 26B. As this diffusion of metal atoms occurs in a more or less spontaneous fashion it causes voids to form in the fuse element 14 and eventually to cause the fuse element 14 to rupture, as reflected by the space or void 30 in FIG. 1D. After the fuse element 14 is ruptured, the e-fuse 100 is in the programmed state and the e-fuse 100 disclosed herein will not allow current to pass.

Figure 2A:
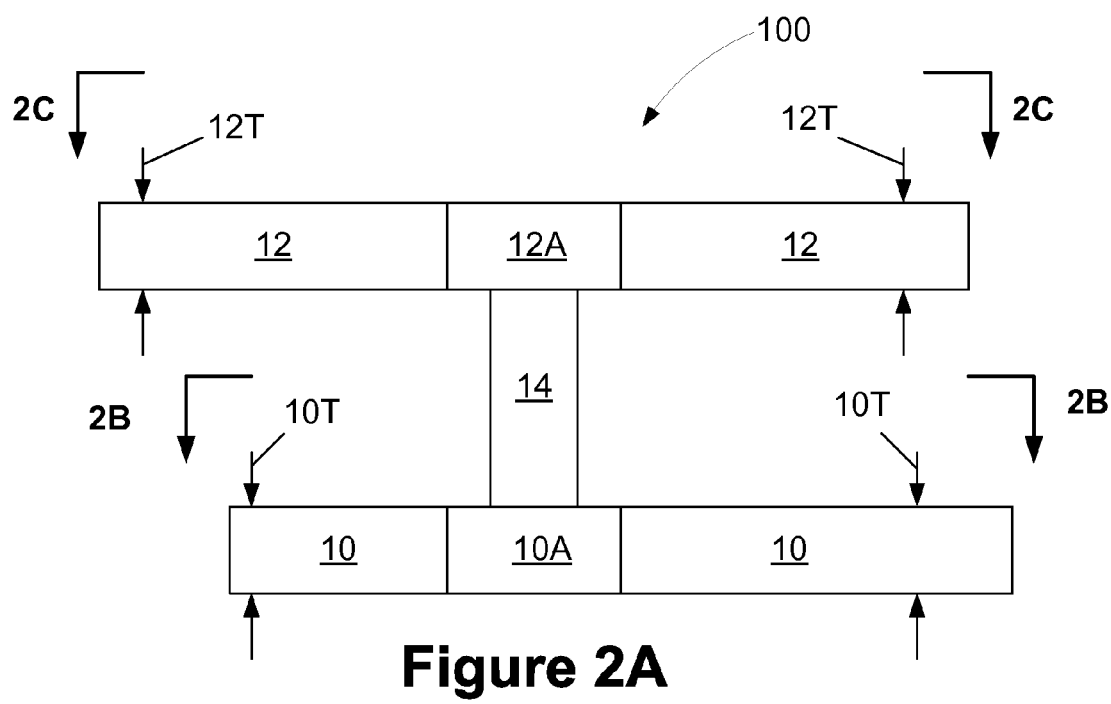
FIGS. 2A-2C depict another illustrative embodiment of the novel e-fuse structure disclosed herein.
Figure 2B:
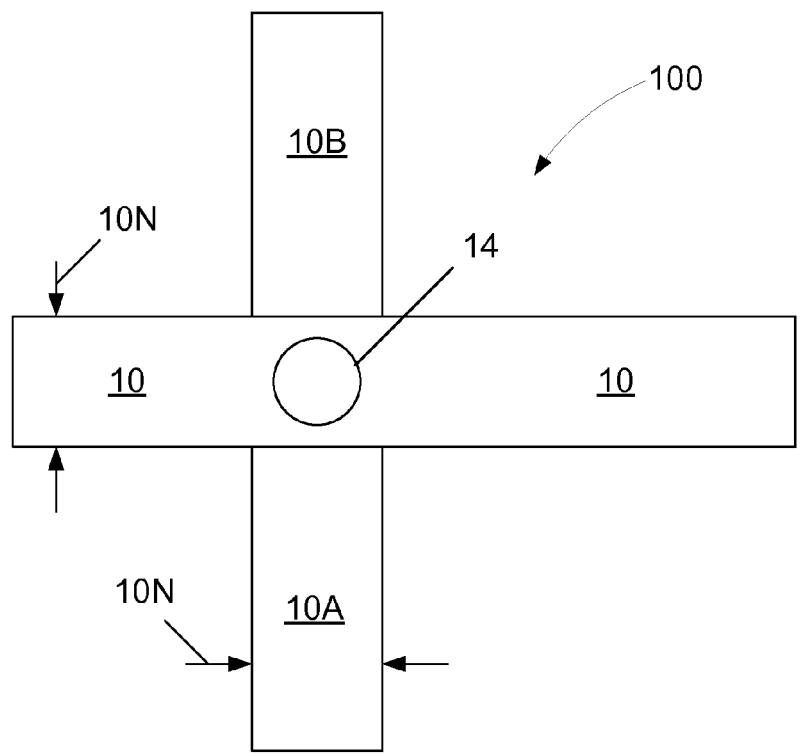
Figure 2C:
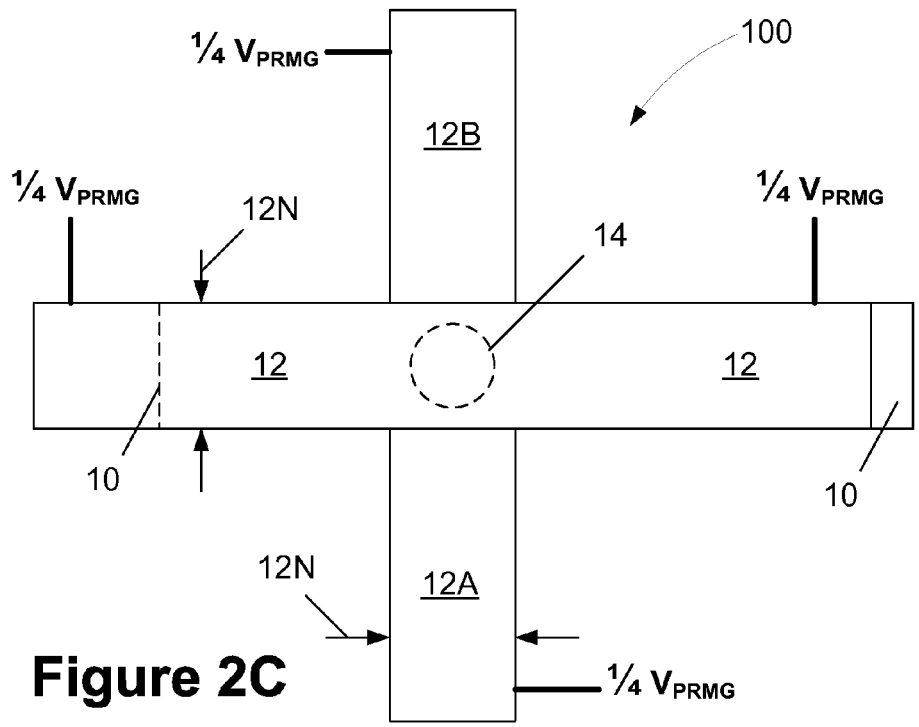

FIGS. 2A-2C depict another illustrative configuration of the e-fuse 100 disclosed herein. In FIGS. 2A-2C, only the configuration of the metal lines and the fuse element 14 are depicted. FIG. 2A is a cross-sectional view of the e-fuse 100, while FIGS. 2B and 2C are taken as indicated in FIG. 2A. Instead of using the relatively wide lines 10, 12 described above to connect to the fuse element 14 (so as to keep the programming current density relatively low in the wide lines 10, 12), this illustrative embodiment of the e-fuse 100 has multiple lines 12, 12A, 12B that are conductively coupled to the upper end of the fuse element 14, and multiple lines 10, 10A, 10B that are conductively coupled to the lower end of the fuse element 14. By using this multiple lines approach, the programming current density in each of the lines 12, 12A, 12B and 10, 10A, 10B can be relatively low as the programming current 22 flows generally from the "12" lines, through the fuse element 14 and out the "10" lines, while the combined current flow from the lines 12, 12A, 12B flowing through the fuse element 14 establishes a relatively high programming current density in the fuse element 14 to thereby form the intermetallic compound regions 26A, 26B, as described above.

The size and number of the lines 10, 12 that are connected to the fuse element in this embodiment of the e-fuse 100 may vary depending upon the particular application. In the depicted example, there are three illustrative lines coupled to the top and bottom of the fuse element 14. The "10" lines and "12" lines may have a width 10N, 12N, that is at most 2-3 times as wide as the width dimension 14D of the fuse element 14. That is, in this embodiment, "10" lines and "12" lines may have widths that correspond to or are close to the same width as various metal lines formed as part of the electrical wiring system for the integrated circuit product.

With reference to FIG. 2C, one-quarter of the programming voltage ($V_{PRMG}$) is applied to the each end of the metal line 12 and to each of the lines 12A, 12B to cause the programming current 22 to flow through the fuse element 14 and then out through the metal lines 10, 10A, 10B. Of course, the one-quarter programming voltage ($V_{PRMG}$) could be applied to each end of the line 10 and to the lines 10A and 10B to cause the programming current 22 to flow in the opposite direction through the fuse element 14.

Figure 3:
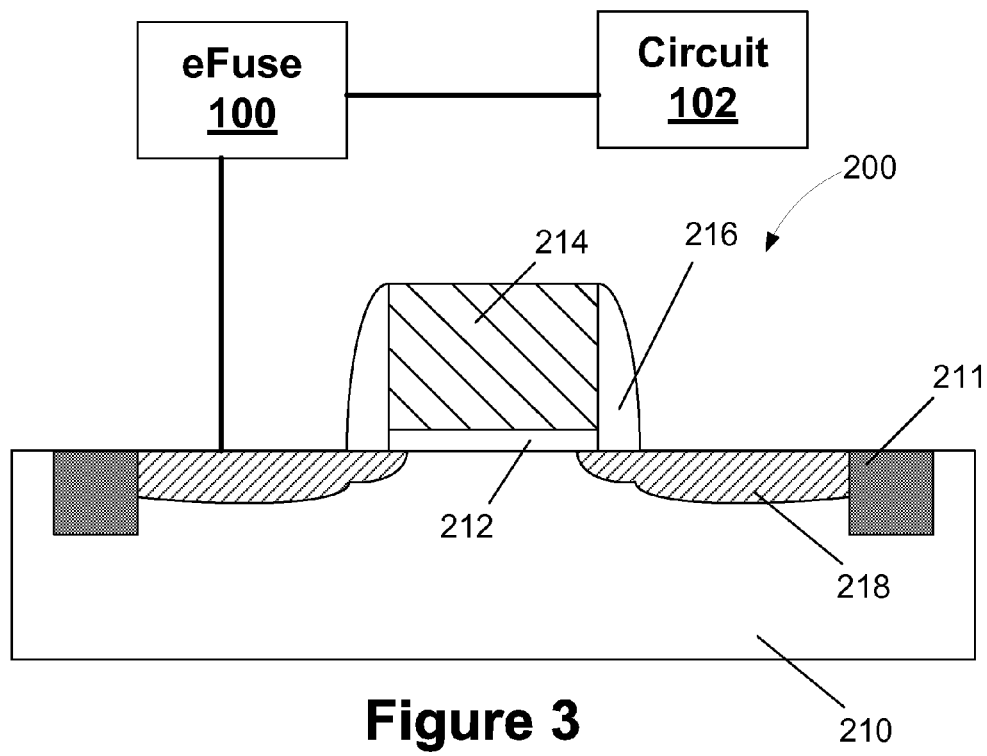
FIG. 3 is a schematic depiction of one illustrative example wherein the novel e-fuse structure disclosed herein may be employed.

FIG. 3 depicts an illustrative example wherein the e-fuse 100 disclosed herein is positioned between a circuit 102 and an illustrative and simplistically depicted pass transistor 200 that may be part of a memory array (not shown). More specifically, the e-fuse 100 is conductively coupled to the source/drain region of the pass transistor 200. Until the e-fuse 100 is blown or "programmed," the circuit 102 is conductively coupled to the pass transistor 200 and the transistor 200, when an appropriate voltage is applied to the gate electrode 214, can serve its function of allowing a signal to "pass" to a memory cell where an electrical charge is stored on a memory device, such as a DRAM capacitor.

As shown in FIG. 3, the transistor structure 200 is formed above a semiconducting substrate 210 in an active area defined by a shallow trench isolation structure 211. The transistor 200 includes a gate insulation layer 212, a gate electrode 214, sidewall spacers 216 and source/drain regions 218 formed in the substrate 210. The various components and structures of the transistor 200 may be formed using a variety of different materials and by performing a variety of known techniques. For example, the gate insulation layer 212 may be comprised of silicon dioxide, the gate electrode 14 may be comprised of polysilicon and the sidewall spacers 216 may be comprised of silicon nitride. The source/drain regions 218 may be comprised of implanted dopant materials (N-type dopants for NMOS devices and P-type dopant for PMOS devices) that are implanted into the substrate using known masking and ion implantation techniques. Of course, those skilled in the art will recognize that there are other features of the transistor 200 that are not depicted in the drawings for purposes of clarity. For example, various metal silicide regions that will be formed on at least the source/drain regions 18 of the transistor and so called halo implant regions are not depicted in the drawings. The transistor 200 may be formed using gate-last or gate-first techniques.

Until the e-fuse 100 is blown or "programmed," the circuit 102 is conductively coupled to the pass transistor 200. When an appropriate voltage is applied to the gate electrode 214, the transistor 200 allows a current to "pass" through the transistor 200 (from the source to the drain) to a memory cell where an electrical charge is stored on a memory device, such as a DRAM capacitor. The pass transistor 200 may be energized so as to allow access to a memory cell for "read" operations. However, when the e-fuse 100 is blown or programmed by applying the programming voltage as described above, the conductive path between the circuit 102 and the pass transistor 200 is broken, and access to the attached memory cell is forever prevented though that formerly conductive path. In general, in one example, the inventions disclosed herein may be employed in applications where fuses are employed to switch on/off redundancy or change the operating characteristics or performance characteristics of an integrated circuit product. For example, the inventions disclosed herein may be employed in connection with turning on or off certain aspects in SRAM (arrays) or serial numbers, or to define speed grades of an integrated circuit device such as a CPU.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A device, comprising:
   a first metal line;
   a second metal line; and
   a fuse element positioned between and conductively coupled to each of said first and second metal lines, said fuse element being adapted to be blown by passing a programming current therethrough and to form an intermetallic compound in at least a region between said fuse element and at least one of said first and second metal lines when said programming current is passed through said fuse element for a sufficient time to blow said fuse element, said fuse element being comprised of a material that is different from a material of construction of at least one of said first and second metal lines.

2. The device of claim 1, wherein said first metal line is comprised of a first material and said second metal line is comprised of a second material that is different from said first material.

3. The device of claim 1, wherein said fuse element is conductively coupled to a pass transistor in a memory array.

4. The device of claim 1, wherein said fuse element is a conductive plug having a generally cylindrical configuration.

5. The device of claim 1, wherein said fuse element has a width dimension and wherein at least one of said first and second metal lines has a width that is 5-8 times as large as said width dimension of said fuse element.

6. The device of claim 1 further comprising:
   a first plurality of additional metal lines that are conductively coupled to said first metal line and to said fuse element; and
   a second plurality of additional metal lines that are conductively coupled to said second metal line and to said fuse element.

7. The device of claim 1, wherein said first metal line is comprised of aluminum, said second metal line is comprised of copper and said fuse element is comprised of copper.

8. The device of claim 2, wherein said fuse element is comprised of said first material.

9. The device of claim 2, wherein said fuse element is comprised of said second material.

10. A device, comprising:
    a first metal line comprised of a first material;
    a second metal line comprised of a second material that is different from said first material; and
    a fuse element positioned between and conductively coupled to each of said first and second metal lines, said fuse element being adapted to be blown by passing a programming current therethrough and to form an intermetallic compound in at least a region between said fuse element and at least one of said first and second metal lines when said programming current is passed through said fuse element for a sufficient time to blow said fuse element.

11. The device of claim 10, wherein said fuse element is comprised of said first material.

12. The device of claim 10, wherein said fuse element is comprised of said second material.

13. The device of claim 10, wherein said fuse element is comprised of a third material that is different from either said first material or said second material.

14. The device of claim 10, wherein said fuse element is conductively coupled to a pass transistor in a memory array.

15. The device of claim 10, wherein said fuse element has a width dimension and wherein at least one of said first and second metal lines has a width that is 5-8 times as large as said width dimension of said fuse element.

16. The device of claim 10, further comprising:
    a first plurality of additional metal lines that are conductively coupled to said first metal line and to said fuse element; and
    a second plurality of additional metal lines that are conductively coupled to said second metal line and to said fuse element.

17. A device, comprising:
    a first metal line comprised of a first material;
    a second metal line comprised of said first material; and
    a fuse element positioned between and conductively coupled to each of said first and second metal lines, said fuse element being comprised of a second material that is different from said first material, said fuse element being adapted to be blown by passing a programming current therethrough and to form an intermetallic compound in at least a region between said fuse element and at least one of said first and second metal lines when said programming current is passed through said fuse element for a sufficient time to blow said fuse element.

18. The device of claim 17, wherein said first material comprises copper and said second material comprises aluminum.

19. The device of claim 17, wherein said fuse element is conductively coupled to a pass transistor in a memory array.

20. The device of claim 17, wherein said fuse element has a width dimension and wherein at least one of said first and second metal lines has a width that is 5-8 times as large as said width dimension of said fuse element.

21. The device of claim 17, further comprising:
    a first plurality of additional metal lines that are conductively coupled to said first metal line and to said fuse element; and
    a second plurality of additional metal lines that are conductively coupled to said second metal line and to said fuse element.

22. A device, comprising:
- a first metal line;
- a second metal line;
- a fuse element positioned between and conductively coupled to each of said first and second metal lines, said fuse element being adapted to be blown by passing a programming current therethrough, said fuse element being comprised of a material that is different from a material of construction of at least one of said first and second metal lines.
- a first plurality of additional metal lines that are conductively coupled to said first metal line and to said fuse element; and
- a second plurality of additional metal lines that are conductively coupled to said second metal line and to said fuse element.

23. The device of claim 22, wherein said first metal line is comprised of a first material, said second metal line is comprised of a second material, and said material comprising said fuse element is the same as one of said first and second materials.

24. The device of claim 22, wherein said first metal line is comprised of a first material, said second metal line is comprised of a second material, and said material comprising said fuse element is different from said first and second materials.

* * * * *